United States Patent
Park et al.

(10) Patent No.: US 10,297,386 B2
(45) Date of Patent: May 21, 2019

(54) MULTILAYER CERAMIC CAPACITOR AND BOARD HAVING THE SAME

(71) Applicant: SAMSUNG ELECTRO-MECHANICS CO., LTD., Suwon-si, Gyeonggi-do (KR)

(72) Inventors: Sang Soo Park, Suwon-si (KR); Min Cheol Park, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/716,241

(22) Filed: Sep. 26, 2017

(65) Prior Publication Data

US 2018/0019059 A1    Jan. 18, 2018

Related U.S. Application Data

(63) Continuation of application No. 14/628,185, filed on Feb. 20, 2015, now Pat. No. 9,773,615.

(30) Foreign Application Priority Data

Aug. 14, 2014 (KR) .......................... 10-2014-0106309

(51) Int. Cl.
  *H05K 1/18* (2006.01)
  *H01G 4/12* (2006.01)
  (Continued)

(52) U.S. Cl.
  CPC .......... *H01G 4/1227* (2013.01); *H01G 4/232* (2013.01); *H01G 4/30* (2013.01); *H01G 2/065* (2013.01);
  (Continued)

(58) Field of Classification Search
  CPC ................. H05K 1/181; H05K 3/3442; H05K 2201/10015; H01G 4/1227; H01G 4/232; H01G 4/30; H01G 2/065
  (Continued)

(56) References Cited

U.S. PATENT DOCUMENTS 5,835,338 A * 11/1998 Suzuki ..................... H01G 4/30
                                                                361/301.4
7,701,695 B2    4/2010 Sutardja
(Continued)

FOREIGN PATENT DOCUMENTS

JP     2007-235170 A    9/2007
KR  10-2008-0073193 A   8/2008

OTHER PUBLICATIONS

U.S. Notice of Allowance dated Jun. 14, 2017 issued in U.S. Appl. No. 14/628,185.
(Continued)

*Primary Examiner* — Michael P McFadden
(74) *Attorney, Agent, or Firm* — Morgan Lewis & Bockius LLP

(57) ABSTRACT

There are provided a multilayer ceramic capacitor and a board having the same. The multilayer ceramic capacitor includes: three external electrodes disposed to be spaced apart from one another on a mounting surface of a ceramic body; first internal electrodes each including first and second lead portions connected to the outermost external electrodes, respectively; and second internal electrodes each including a third lead portion connected to the middle external electrode, in which a first region in which the first internal electrodes are laminated is disposed in a central portion of the ceramic body in a width direction of the ceramic body, and second regions in which the first and second internal electrodes are alternately laminated are disposed on both
(Continued)

sides of the intervening first region in the width direction of the ceramic body.

9 Claims, 15 Drawing Sheets

(51) Int. Cl.
    *H01G 4/232*     (2006.01)
    *H01G 4/30*     (2006.01)
    *H01G 2/06*     (2006.01)
    *H05K 3/34*     (2006.01)

(52) U.S. Cl.
    CPC . *H05K 3/3442* (2013.01); *H05K 2201/10015* (2013.01)

(58) Field of Classification Search
    USPC ...................................... 361/301.4
    See application file for complete search history.

(56) References Cited

U.S. PATENT DOCUMENTS

| | | | |
|---|---|---|---|
| 8,120,891 B2* | 2/2012 | Takashima | H01G 4/228 361/303 |
| 8,184,425 B2* | 5/2012 | Lee | H01G 4/228 361/303 |
| 2002/0001770 A1 | 1/2002 | Cameron | |
| 2002/0017700 A1* | 2/2002 | Mori | H01L 23/642 257/532 |
| 2007/0279836 A1 | 12/2007 | Takashima et al. | |
| 2008/0165468 A1* | 7/2008 | Berolini | H01C 7/1006 361/306.3 |
| 2008/0186652 A1* | 8/2008 | Lee | H01G 4/012 361/306.3 |
| 2009/0316330 A1* | 12/2009 | Taniguchi | H01G 4/012 361/306.3 |
| 2012/0188684 A1* | 7/2012 | Akazawa | H01G 4/012 361/321.2 |
| 2013/0057112 A1* | 3/2013 | Shirakawa | H01C 1/148 310/311 |

OTHER PUBLICATIONS

U.S. Final Office Action dated Jan. 6, 2017 issued in U.S. Appl. No. 14/628,185.

U.S. Non-Final Office Action dated Aug. 18, 2016 issued in U.S. Appl. No. 14/628,185.

* cited by examiner

MULTILAYER CERAMIC CAPACITOR AND BOARD HAVING THE SAME

CROSS-REFERENCE TO RELATED APPLICATION

This application is a continuation of U.S. patent application Ser. No. 14/628,185, filed on Feb. 20, 2015 which claims the priority and benefit of Korean Patent Application No. 10-2014-0106309 filed on Aug. 14, 2014, with the Korean Intellectual Property Office, the disclosures of which are incorporated herein by reference.

BACKGROUND

The present disclosure relates to a multilayer ceramic capacitor (MLCC) and a mounting board having the same.

As multifunctional and highly integrated large scale integration (LSI) chips consume significantly large amounts of power, 3-terminal capacitors having excellent high frequency characteristics are commonly used as a countermeasure to remove or attenuate noise generated in a high-frequency circuit, such as a power circuit of an LSI chip.

Since LSI chips consume significantly large amounts of power due to multi-functionalized and highly integrated nature thereof, such 3-terminal capacitors are required to have high allowable currents. In order to allow such 3-terminal capacitors to have high allowable currents, direct current (DC) resistance of the 3-terminal capacitors needs to be reduced.

That is, in order to stabilize a power circuit and effectively remove noise at a high frequency, a 3-terminal multilayer ceramic capacitor should have low DC resistance, while satisfying the requirements of high frequency performance.

SUMMARY

An aspect of the present disclosure may provide a multilayer ceramic capacitor able to be used at high allowable currents by reducing direct current (DC) resistance, having a compact size, and having an enhanced effect of removing noise at high frequencies, and a board having the same.

According to an aspect of the present disclosure, there are provided a multilayer ceramic capacitor (MLCC) and a board having the same. The multilayer ceramic capacitor includes: three external electrodes disposed to be spaced apart from one another on a mounting surface of a ceramic body; first internal electrodes each including first and second lead portions connected to the outermost external electrodes, respectively; and second internal electrodes each including a third lead portion connected to the middle external electrode, in which a first region in which the first internal electrodes are laminated is disposed in a central portion of the ceramic body in a width direction of the ceramic body, and second regions in which the first and second internal electrodes are alternately laminated are disposed on both sides of the intervening first region in the width direction of the ceramic body.

According to another aspect of the present disclosure, there are provided a multilayer ceramic capacitor and a board having the same. The multilayer ceramic capacitor includes: external electrodes disposed on both side surfaces of the ceramic body in a length direction of the ceramic body and a mounting surface of the ceramic body; first internal electrodes disposed to be connected to the outermost external electrodes; and second internal electrodes having lead portions connected to the middle external electrode disposed on the mounting surface of the ceramic body, in which a first region in which the first internal electrodes are laminated is disposed in a central portion of the ceramic body in a width direction of the ceramic body, and second regions in which the first and second internal electrodes are alternately laminated are disposed on both sides of the intervening first region in the width direction of the ceramic body.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
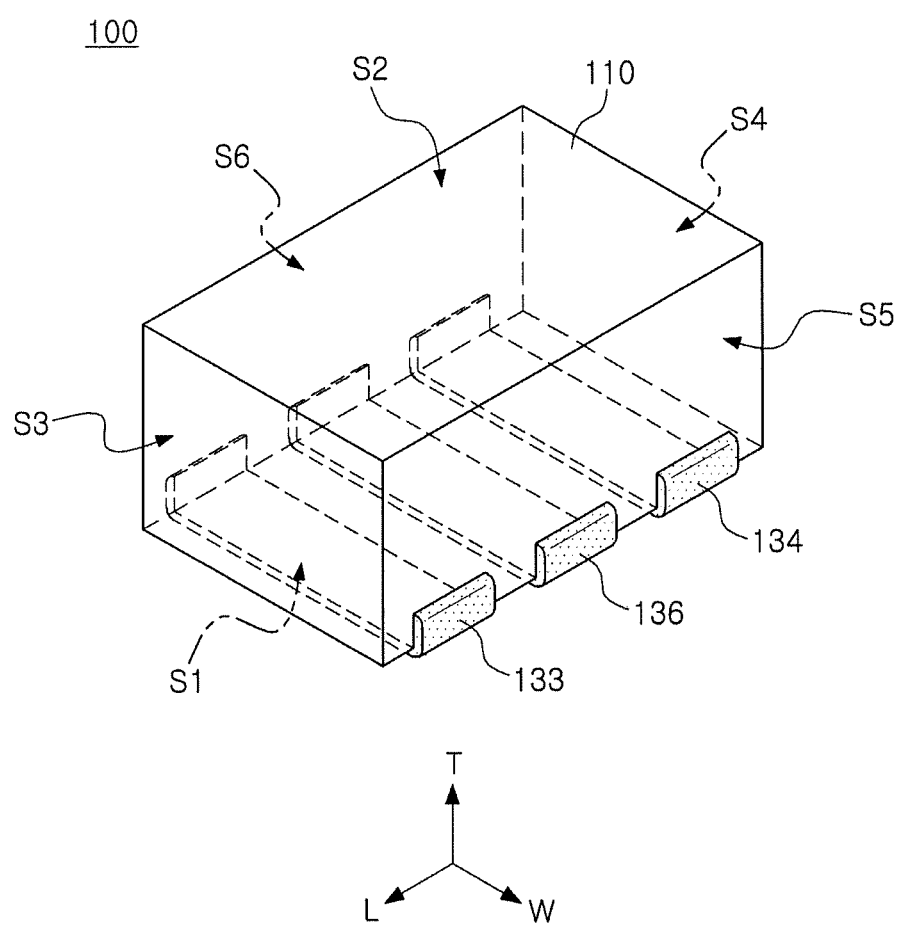
FIG. 1 is a perspective view schematically illustrating a multilayer ceramic capacitor (MLCC) according to an exemplary embodiment in the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

In order to clarify the exemplary embodiments, L, W, and T, defining directions of a hexahedron (six-sided object)

shown in FIG. 1 indicate a length direction, a width direction, and a thickness direction, respectively. Here, the width direction may be used as having the same concept as that of a lamination direction in which dielectric layers are laminated.

Multilayer Ceramic Capacitor (MLCC)

Figure 2:
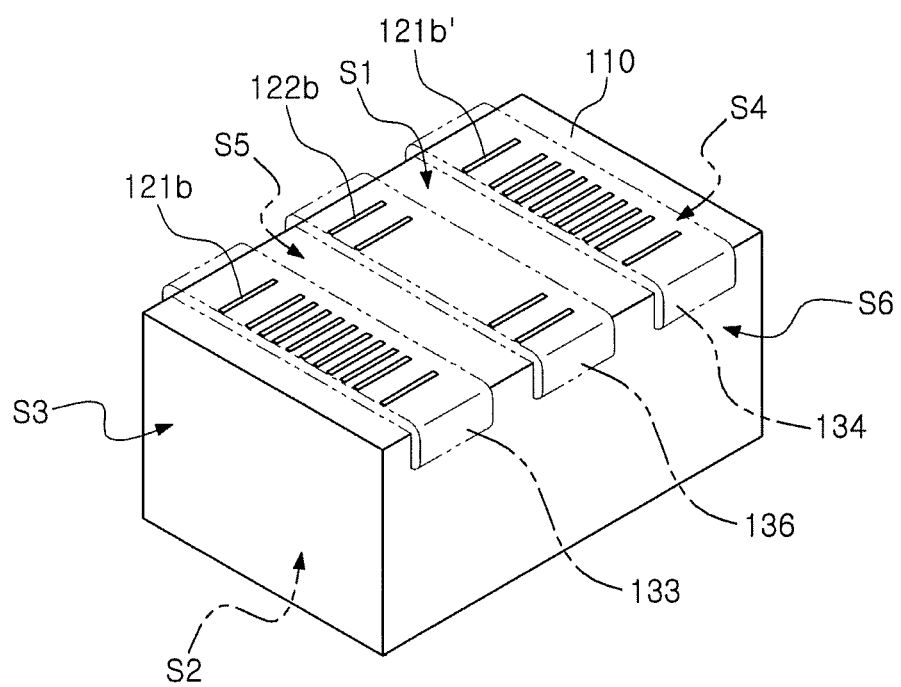
FIG. 2 is a perspective view illustrating a reversed ceramic body of the MLCC of FIG. 1.
Figure 2:
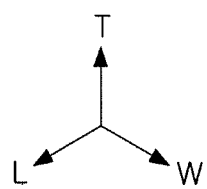
Figure 3:
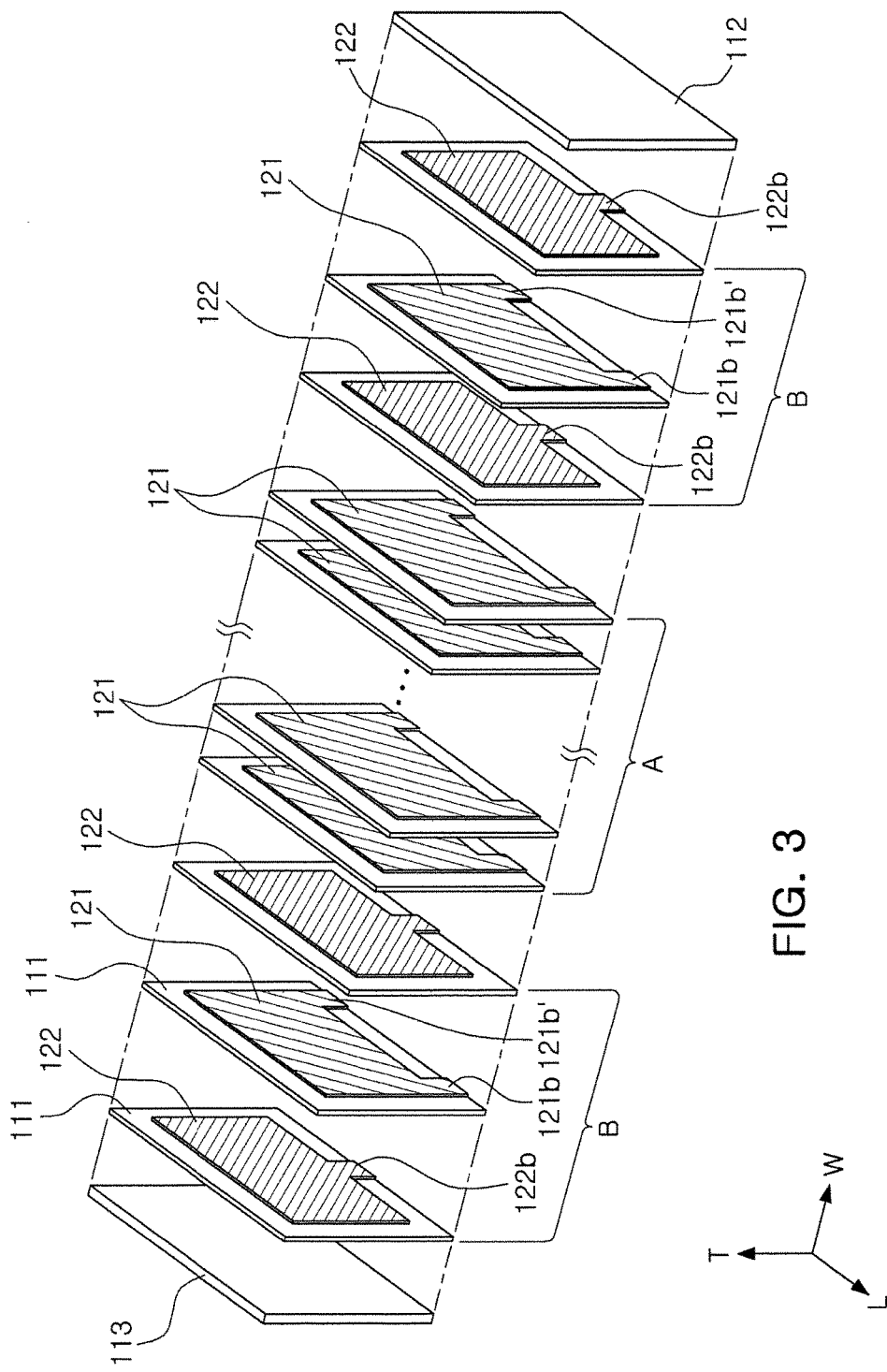
FIG. 3 is an exploded perspective view illustrating the MLCC of FIG. 1 without external electrodes.

FIG. 1 is a perspective view schematically illustrating a multilayer ceramic capacitor (MLCC) according to an exemplary embodiment in the present disclosure, FIG. 2 is a perspective view illustrating a reversed ceramic body of the MLCC of FIG. 1, and FIG. 3 is an exploded perspective view illustrating the MLCC of FIG. 1 without external electrodes.

Referring to FIGS. 1 through 3, an MLCC 100 according to the present exemplary embodiment may include a ceramic body 110 in which a plurality of dielectric layers 111 are laminated in the width direction, first and second internal electrodes 121 and 122, and first to third external electrodes 133, 134, and 136.

That is, the MLCC 100 according to the present exemplary embodiment may be considered as a so-called 3-terminal capacitor having a total of three external terminals.

The ceramic body 110 may be formed by stacking a plurality of dielectric layers 111 in the width direction and subsequently sintering the same.

Also, the plurality of dielectric layers 111 forming the ceramic body 110 may be integrated in a sintered state such that boundaries therebetween may not be readily apparent without the use of a scanning electron microscope (SEM).

The dielectric layers 111 may contain a high-k ceramic powder, for example, barium titanate ($BaTiO_3$) or strontium titanate ($SrTiO_3$)-based ceramic powder. However, the ceramic powder of the dielectric layers 111 is not limited thereto as long as sufficient capacitance can be obtained.

Also, if necessary, a ceramic additive, an organic solvent, a plasticizer, a binder, a dispersant, and the like, may be further added, together with the ceramic powder, to the dielectric layers 111.

The ceramic additive may be a transition metal oxide or carbide, a rare earth element, magnesium (Mg), aluminum (Al), or the like, but types of ceramic additives are not limited thereto.

An average particle diameter of the ceramic powder used in the formation of the dielectric layers 111 is not particularly limited and may be adjusted to achieve the purpose of the present disclosure. For example, the average particle diameter may be adjusted to 400 nm or less.

Although the shape of the ceramic body 110 is not particularly limited, the ceramic body 110 may have a hexahedral shape as illustrated, and the shape and dimensions of the ceramic body 110 and the number of laminated dielectric layers 111 are not limited to those illustrated in the present exemplary embodiment.

In the present exemplary embodiment, the ceramic body 110 may have a first main surface S1 and a second main surface S2 opposing one another in the thickness direction, a first side surface S3 and a second side surface S4 connecting the first main surface S1 and the second main surface S2 and opposing one another in the length direction, and a third side surface S5 and a fourth side surface S6 opposing one another in the width direction. Hereinafter, a mounting surface of the MLCC 100 will be defined as the first main surface S1 of the ceramic body 110.

The ceramic body 110 may include cover layers 112 and 113 which are disposed at the third and fourth side surfaces S5 and S6 of the ceramic body 110, respectively, and form marginal portions.

The cover layers 112 and 113 may have the same material and configuration as those of the dielectric layers 111, except that no internal electrode is included.

The cover layers 112 and 113 may be formed by stacking a single dielectric layer or two or more dielectric layers on second regions B (to be described below) of the ceramic body 110 in the width direction of the ceramic body, and basically serve to prevent damage to the first and second internal electrodes 121 and 122 due to physical or chemical stress.

The ceramic body 110 according to the present exemplary embodiment may include a first region A positioned in a central portion thereof in the width direction of the ceramic body 110 and the second regions B positioned on both sides of the intervening first region A in the width direction of the ceramic body 110.

The first region A may be formed by repeatedly stacking a plurality of first internal electrodes 121 with the dielectric layers ill interposed therebetween in the width direction of the ceramic body 110.

Direct current (DC) resistance of the capacitor is in inverse proportion to the number of internal electrodes laminated in the first region A.

Thus, an increase in the number of first internal electrodes 121 of the first region A may reduce DC resistance, whereby an allowable current value of the capacitor may be set to be high.

Here, in order to increase the number of internal electrodes 121 of the first region A, the thicknesses of the dielectric layers 111 in the first region A may be reduced to increase electrode density.

The second region B may be formed by repeatedly alternately stacking one or more first and second internal electrodes 121 and 122 with at least one of the dielectric layers 111 interposed therebetween.

Here, overlapping portions of the first and second internal electrodes 121 and 122 serve as capacitance layers, and contribute to the formation of capacitance.

The first and second internal electrodes 121 and 122, having opposing polarities, are disposed within the ceramic body 110, and may be electrically insulated from each other by the intervening dielectric layers 111.

Materials used to form the first and second internal electrodes 121 and 122 are not particularly limited and, for example, a conductive paste formed of at least one of silver (Ag), palladium (Pd), platinum (Pt), nickel (Ni), copper (Cu), and alloys thereof may be used.

Here, as a method of printing the conductive paste, a screen printing method, a gravure printing method, or the like, may be used, but the printing method is not limited thereto.

Each of the internal electrodes in the present exemplary embodiment may include a body portion overlapping a neighbor internal electrode and a lead portion extending from the body portion so as to be led out of the ceramic body 110.

Here, although not particularly limited thereto, for example, a length of the lead portion may be shorter than a length of the body portion in the length direction of the ceramic body 110.

In the present exemplary embodiment, first and second lead portions 121$b$ and 121$b'$ maybe disposed to be spaced apart from one another in the length direction of the ceramic body 110, and may extend from the first internal electrode 121 to be exposed to the first main surface S1 of the ceramic body 110 which is a mounting surface of the ceramic body 110. Here, the first internal electrode 121 serves as a signal.

Also, a third lead portion 122b may be disposed between the first and second lead portions 121b and 121b' in the length direction of the ceramic body 110 and spaced apart from the first and second lead portions 121b and 121b', and may extend from the second internal electrode 122 to be exposed to the first main surface S1 of the ceramic body 110. Here, the second internal electrode 122 serves as a ground.

The first and second external electrodes 133 and 134 may have the same polarity. The first and second external electrodes 133 and 134 may be disposed to be spaced apart from one another on the first main surface S1 in the length direction of the ceramic body 110 and may be in contact with the first and second lead portions 121b and 121b' exposed to the first main surface S1 of the ceramic body 110 so as to be electrically connected thereto, respectively. The first and second external electrodes 133 and 134 may be utilized as signal terminals, power terminals, and the like.

The first and second external electrodes 133 and 134 may extend from the first main surface S1 of the ceramic body 110 to portions of the third and fourth side surfaces S5 and S6 of the ceramic body 110 in the width direction of the ceramic body 110. Thus, adhesive strength of the first and second external electrodes 133 and 134 with respect to the ceramic body 110 may be enhanced.

A polarity of the third external electrode 136 may be different from the polarity of the first and second external electrodes 133 and 134. In the present exemplary embodiment, the third external electrode 136 may be utilized as a ground terminal.

The third external electrode 136 maybe disposed between the first and second external electrodes 133 and 134, and may be in contact with the third lead portion 122b exposed to the first main surface S1 of the ceramic body 110 so as to be electrically connected thereto.

The third external electrode 136 may extend from the first main surface S1 of the ceramic body 110 to portions of the third and fourth side surfaces S5 and S6 of the ceramic body 110 in the width direction of the ceramic body 110.

The capacitor in the present exemplary embodiment has a 3-terminal structure in which three external electrodes are disposed to be adjacent to each other. Thus, since distances between the first and second external electrodes 133 and 134 and the third external electrode 136 are very small, a current loop may be reduced to decrease inductance of the capacitor.

The first to third external electrodes 133, 134, and 136 may be formed by applying and sintering a conductive paste prepared by adding glass frits to conductive metal powder. However, the method of forming the first to third external electrodes 133, 134, and 136 is not limited thereto. Here, the conductive metal may be, for example, silver (Ag), nickel (Ni), or copper (Cu), but the conductive metal is not limited thereto.

A plating layer (not shown) may be fanned on the first to third external electrodes 133, 134, and 136, if necessary. The plating layer serves to increase adhesion strength between the multilayer ceramic capacitor 100 and a circuit board when the multilayer ceramic capacitor 100 is mounted on the circuit board using solders.

The plating layer may include, for example, a nickel (Ni) plating layer formed on each of the first to third external electrodes 133, 134, and 136 and a tin (Sn) plating layer formed on the nickel plating layer. However, the present inventive concept is not limited thereto.

Modified Example

Figure 4:
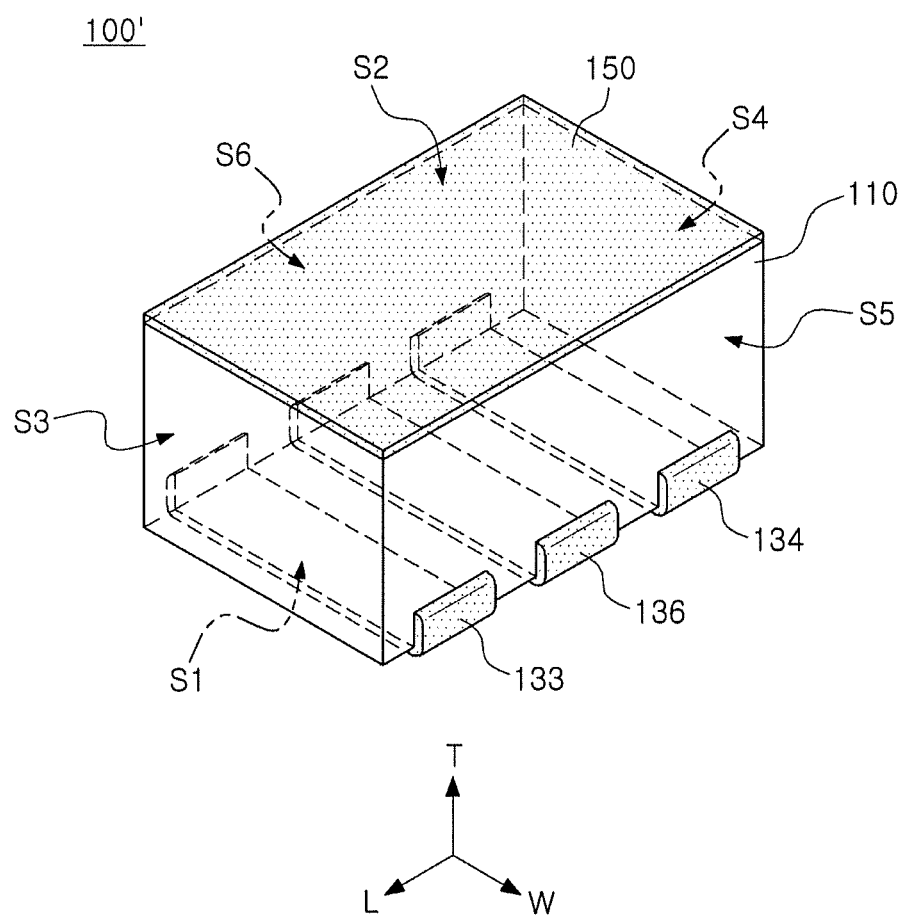
FIG. 4 is a perspective view schematically illustrating an MLCC according to another exemplary embodiment in the present disclosure.
Figure 5:
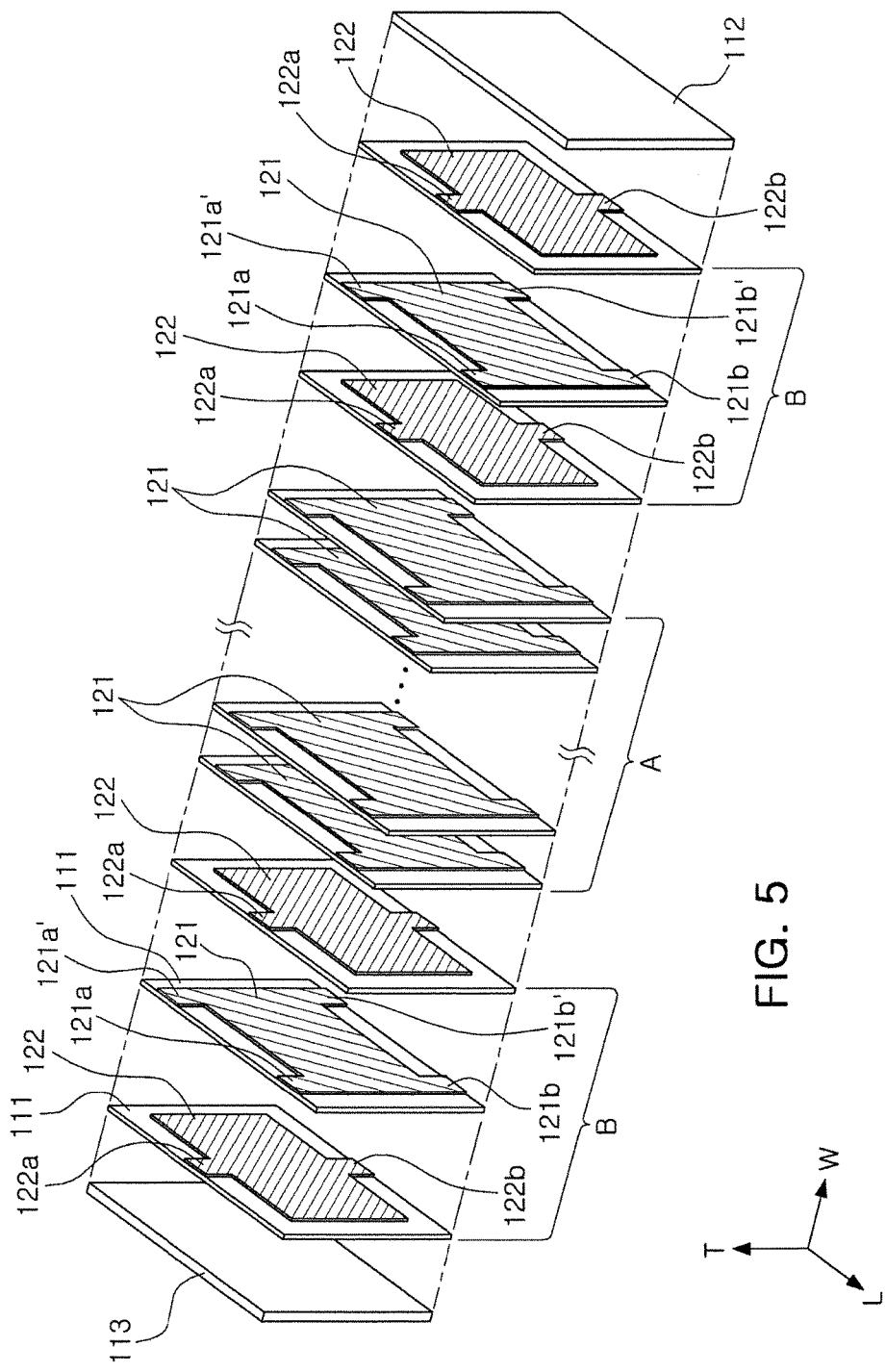
FIG. 5 is an exploded perspective view illustrating the MLCC of FIG. 4 without external electrodes.

FIG. 4 is a perspective view schematically illustrating an MLCC according to another exemplary embodiment in the present disclosure, and FIG. 5 is an exploded perspective view illustrating the MLCC of FIG. 4 without external electrodes.

Here, the structure of the ceramic body 110 is the same as that of the previous exemplary embodiment, and thus, a detailed description thereof will be omitted so as to avoid redundancy, and the first and second internal electrodes 121 and 122 and an insulating layer 150 having a structure different from that of the previous exemplary embodiment will be described in detail.

Referring to FIGS. 4 and 5, in an MLCC 100' according to the present exemplary embodiment, an insulating layer 150 may be disposed on the second main surface S2 opposing the mounting surface of the ceramic body 110.

The insulating layer 150 may serve to prevent penetration of moisture, or the like, through portions of first and second internal electrodes which are exposed externally, thereby avoiding the degradation of reliability.

Each of first internal electrodes 121 may have fourth and fifth lead portions 121a and 121a' exposed to the second main surface S2 of the ceramic body 110 so as to be in contact with the insulating layer 150 disposed on the second main surface S2 of the ceramic body 110.

Each of second internal electrodes 122 may have a sixth lead portion 122a disposed between the fourth and fifth lead portions 121a and 121a' and exposed to the second main surface S2 of the ceramic body 110 so as to be in contact with the insulating layer 150.

Figure 6:
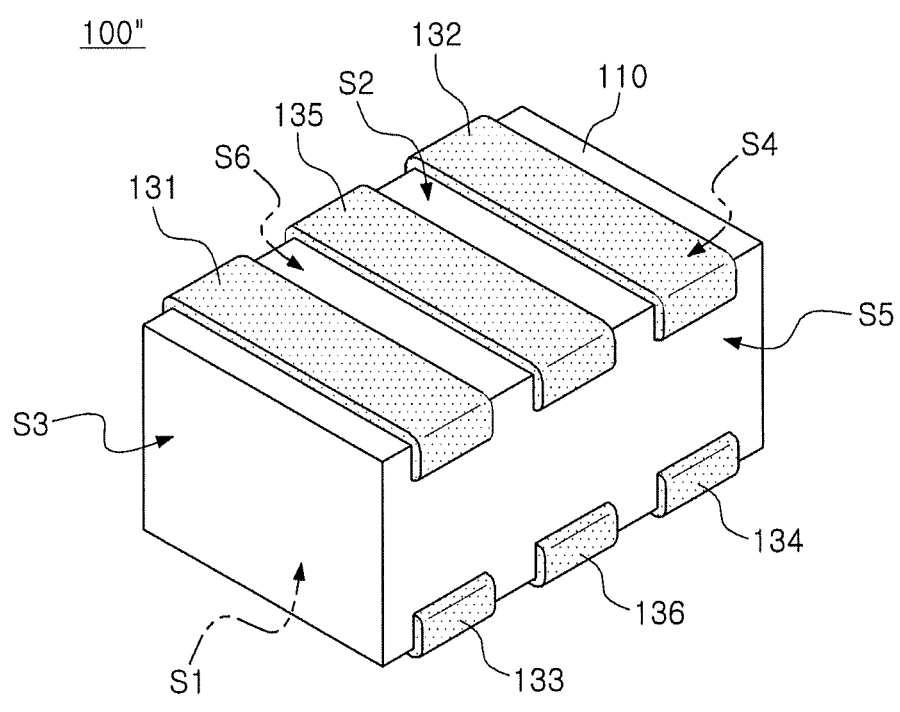
FIG. 6 is a perspective view schematically illustrating an MLCC according to another exemplary embodiment in the present disclosure.
Figure 7:
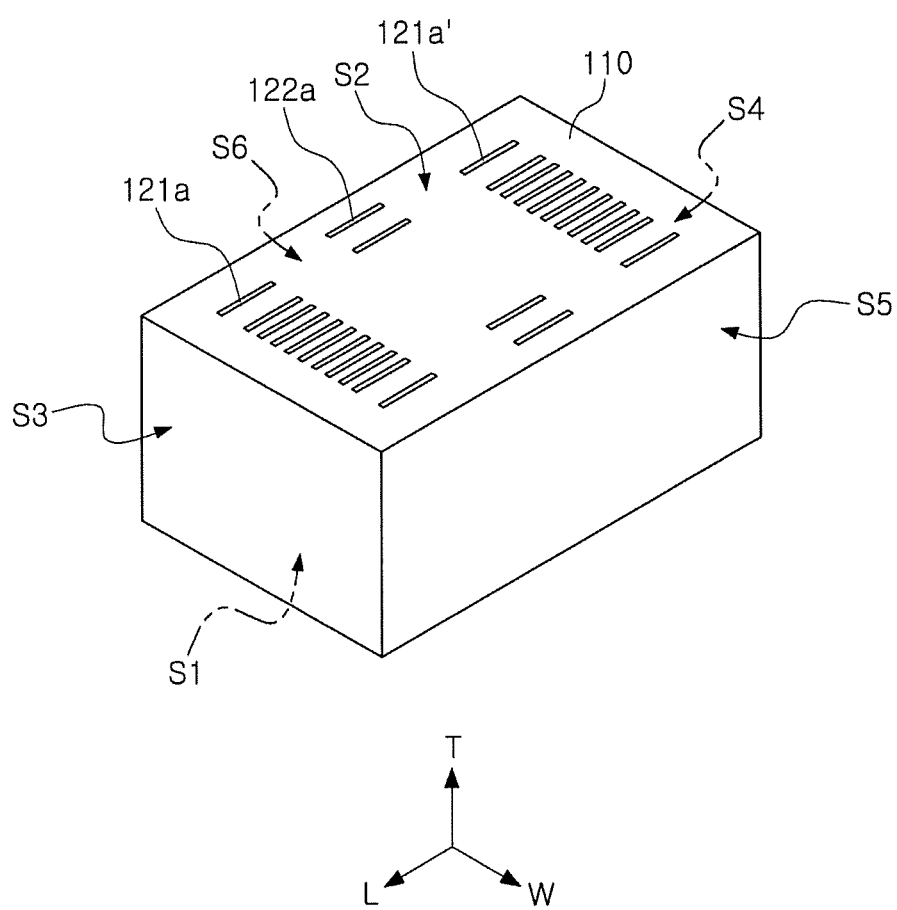
FIG. 7 is a perspective view illustrating a ceramic body of the MLCC of FIG. 6.
Figure 8:
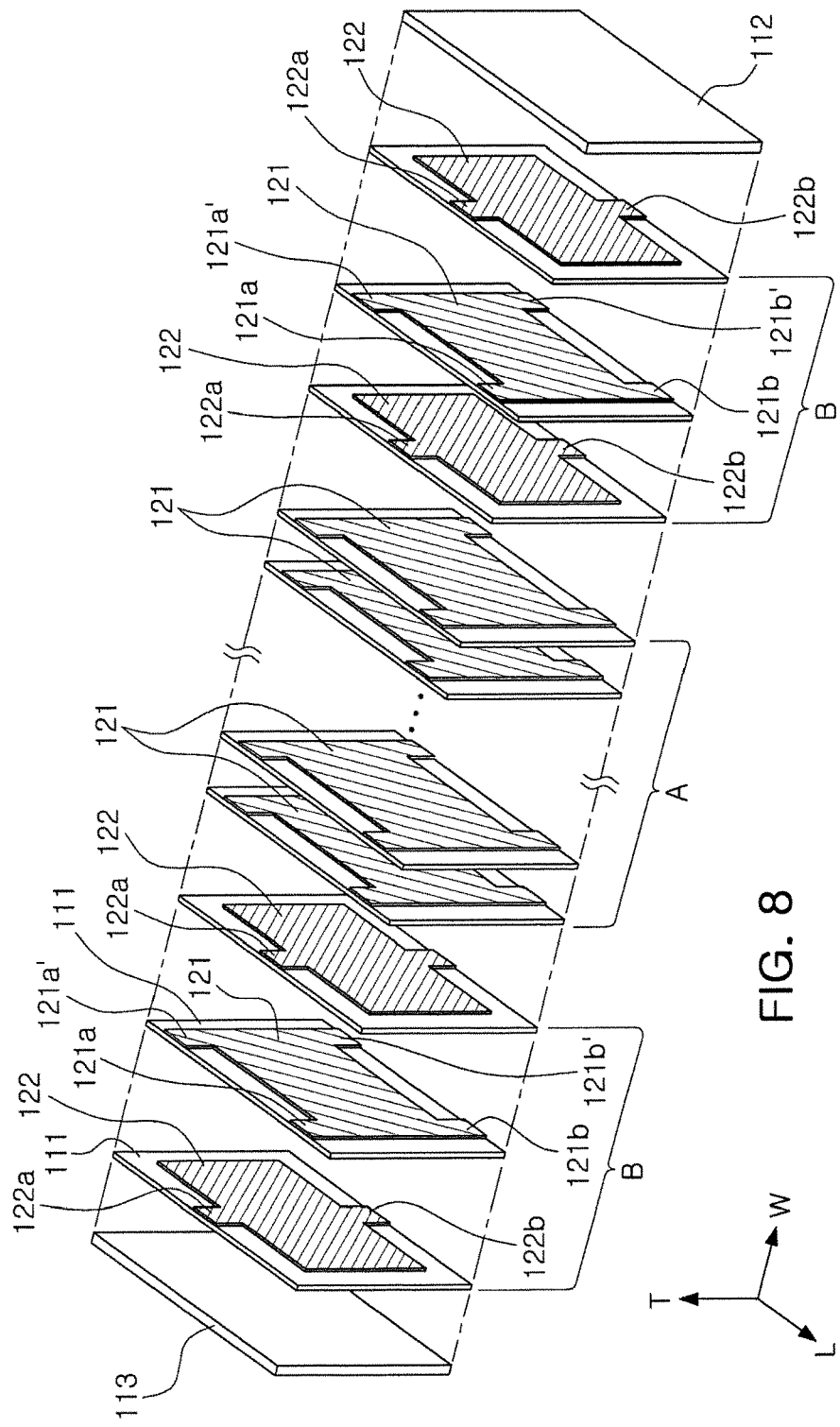
FIG. 8 is an exploded perspective view illustrating the MLCC of FIG. 6 without external electrodes.

FIG. 6 is a perspective view schematically illustrating an MLCC according to another exemplary embodiment in the present disclosure, FIG. 7 is a perspective view illustrating a ceramic body of the MLCC of FIG. 6, and FIG. 8 is an exploded perspective view illustrating the MLCC of FIG. 6 without external electrodes.

Here, the structure of the ceramic body 110 is the same as that of the previous exemplary embodiment, and thus, a detailed description thereof will be omitted so as to avoid redundancy, and fourth to sixth external electrodes 131, 132, and 135 and the first and second internal electrodes 121 and 122 having a structure different from that of the previous exemplary embodiment will be described in detail.

Referring to FIGS. 6 through 8, in an MLCC 100" of the present exemplary embodiment, the fourth to sixth external electrodes 131, 132, and 135 may be disposed on the second main surface S2 of the ceramic body 110 to face the first to third external electrodes 133, 134, and 136.

Namely, the MLCC 100" may have a vertically symmetrical structure in which the first to third external electrodes 133, 134, and 136, face the fourth to sixth external electrodes 131, 132, and 135, respectively, thereby eliminating directionality thereof when mounted, whereby the manufacturing process may be simplified.

Here, the fourth to sixth external electrodes 131, 132, and 135 may extend to portions of the third and fourth side surfaces S5 and S6 of the ceramic body 110 in the width direction of the ceramic body 110, if necessary.

The fourth to sixth external electrodes 131, 132, and 135 may be formed of a conductive metal.

If necessary, a plating layer (not shown) may be formed on the fourth to sixth external electrodes 131, 132, and 135.

Each of first internal electrodes 121 may have fourth and fifth lead portions 121a and 121a' exposed to the second main surface S2 of the ceramic body 110 so as to be connected to the fourth and fifth external electrodes 131 and 132 formed on the second main surface S2 of the ceramic body 110.

Each of second internal electrodes 122 may have a sixth lead portion 122a disposed between the third and fourth lead portions 121a and 121a' and exposed to the second main surface S2 of the ceramic body 110 so as to be connected to the sixth external electrode 135.

In a case in which the internal and external structures of the MLCC 100" are vertically symmetrical, directionality of the capacitor may be eliminated.

Thus, since any of the first and second main surfaces S1 and S2 of the MLCC 100" may be provided as a mounting surface, there is no need to consider a direction of the mounting surface when the MLCC 100" is mounted on a circuit board.

Figure 9:
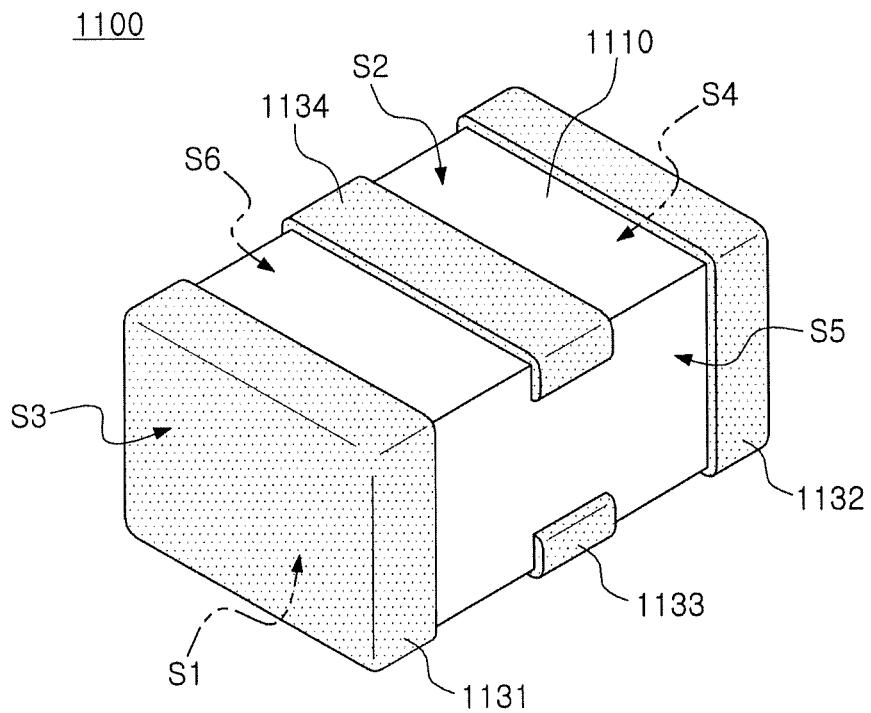
FIG. 9 is a perspective view schematically illustrating an MLCC according to another exemplary embodiment in the present disclosure.
Figure 9:
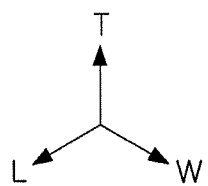
Figure 10:
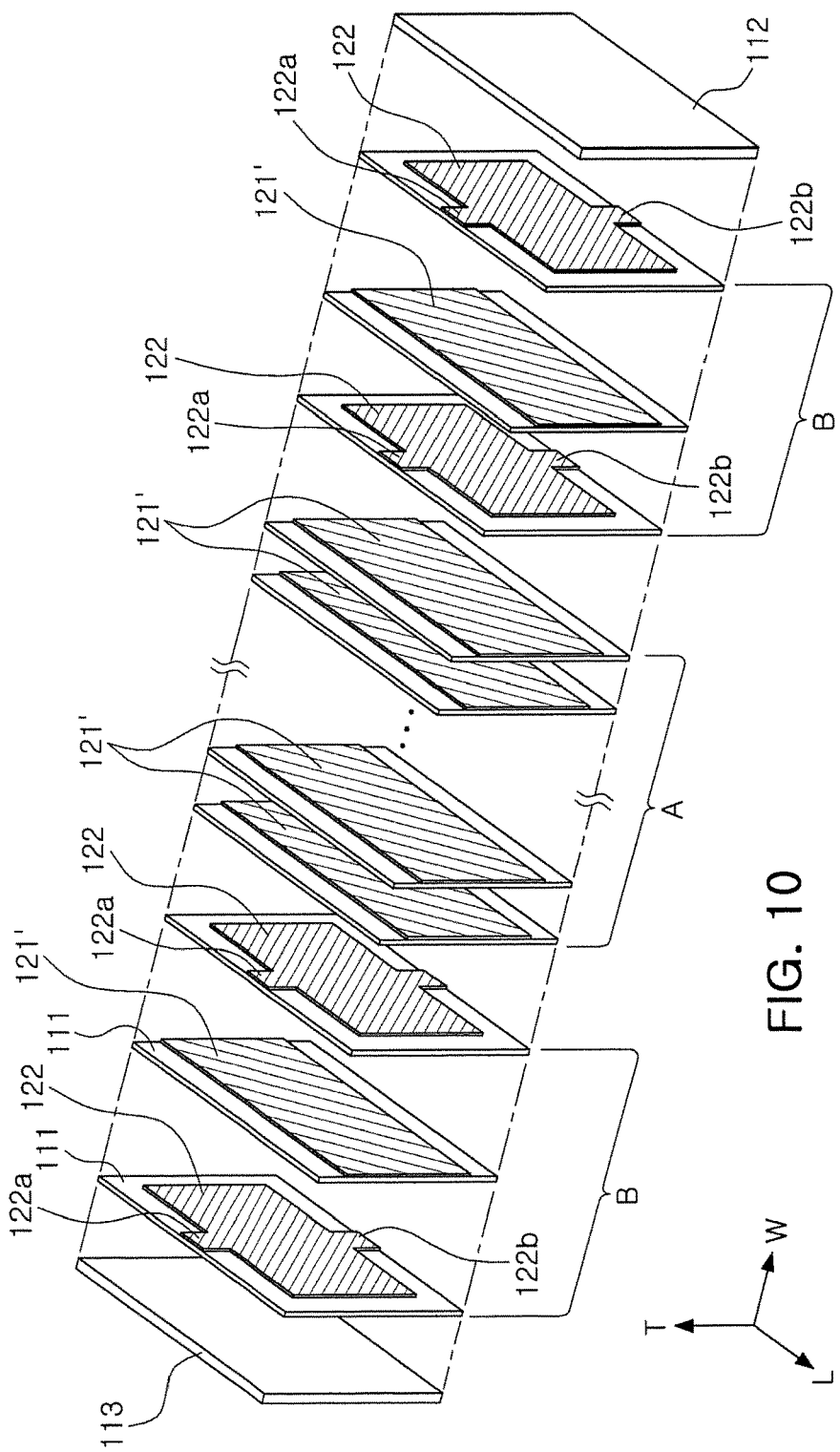
FIG. 10 is an exploded perspective view illustrating an internal electrode structure in the MLCC of FIG. 9.

FIG. 9 is a perspective view schematically illustrating an MLCC according to another exemplary embodiment in the present disclosure, and FIG. 10 is an exploded perspective view illustrating an internal electrode structure of the MLCC of FIG. 9.

Here, the structure of the ceramic body 110 is the same as that of the previous exemplary embodiment, and thus, a detailed description thereof will be omitted so as to avoid redundancy, and first and second internal electrodes 121' and 122 and first to fourth terminal electrodes 1131 to 1134 having a structure different from that of the previous exemplary embodiment will be described in detail.

Referring to FIGS. 9 and 10, in an MLCC 1100 of the present exemplary embodiment, each of first internal electrodes 121' may be exposed to the first and second side surfaces S3 and S4 of the ceramic body 110 in the length direction of the ceramic body 110. The structure of the second internal electrodes 122 is similar to that of the structure thereof in the capacitor of FIG. 6.

First and second terminal electrodes 1131 and 1132 may be disposed on the third and fourth side surfaces S3 and S4 of the ceramic body 110 so as to be connected to both exposed end portions of the first internal electrodes 121', respectively.

Here, the first and second terminal electrodes 1131 and 1132 may cover both end portions of the ceramic body 110 in the length direction of the ceramic body 110.

Thus, adhesive strength of the first and second terminal electrodes 1131 and 1132 with respect to the ceramic body 110 may be enhanced.

Third and fourth terminal electrodes 1133 and 1134 may be disposed on the first and second main surfaces S1 and S2 of the ceramic body 110 so as to be connected to third and sixth lead portions 122b and 122a of the second internal electrodes 122, respectively.

Here, the third and fourth terminal electrodes 1133 and 1134 may extend from the first and second main surfaces S1 and S2 of the ceramic body 110 to portions of the first and second side surfaces S3 and S4 of the ceramic body 110 in the width direction of the ceramic body 110.

Figure 11:
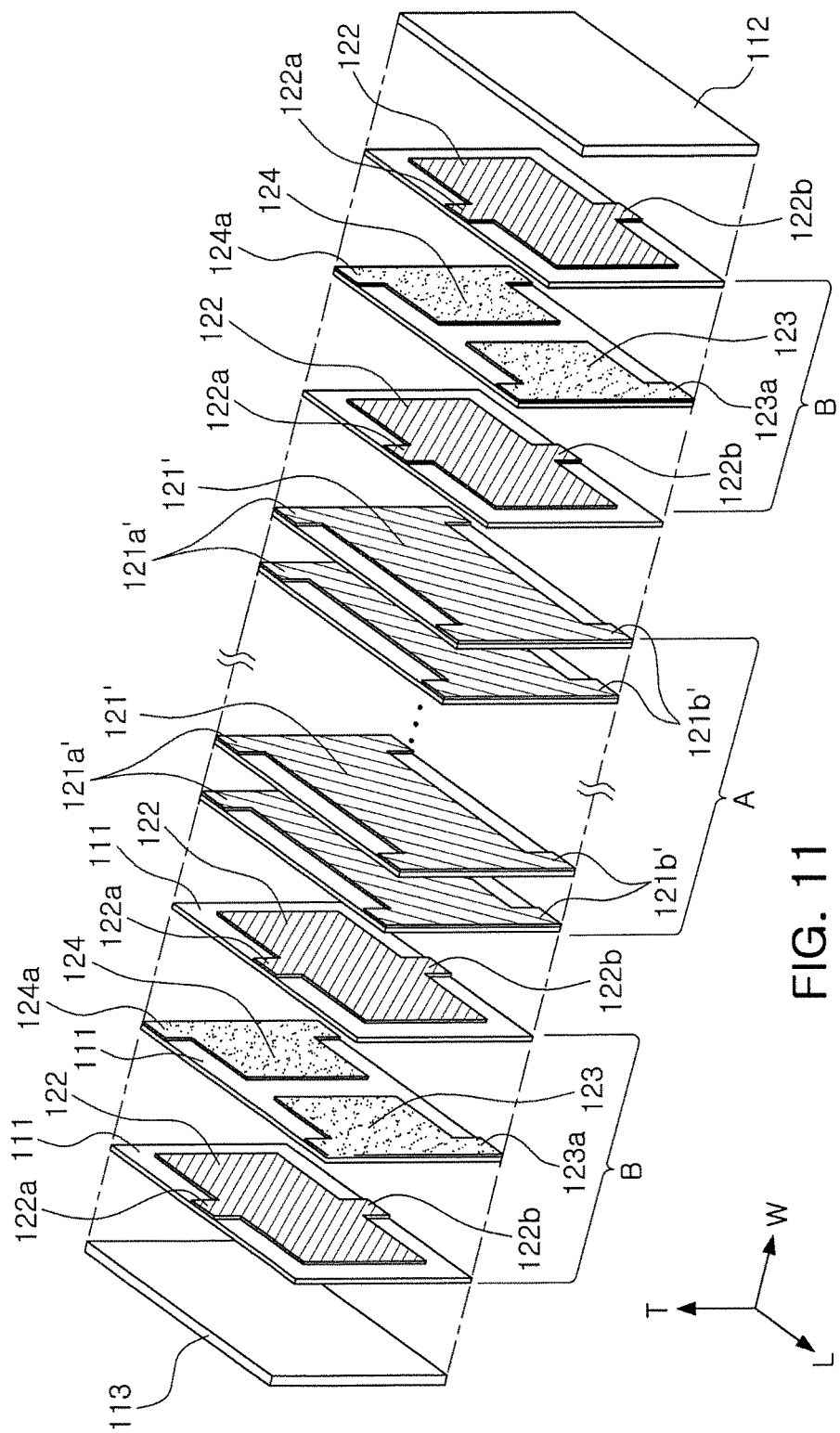
FIG. 11 is an exploded perspective view illustrating another example of an internal electrode structure in the MLCC of FIG. 9.

FIG. 11 is an exploded perspective view illustrating another example of an internal electrode structure in the MLCC of FIG. 9.

Referring to FIG. 11, in the present exemplary embodiment, the structure of the first internal structures in the second region B is modified.

Each of first internal electrodes in the present exemplary embodiment may include first and second electrode patterns 123 and 124 formed to be spaced apart from one another on the basis of a central portion thereof.

Here, lead portions 123a and 124a may extend from both end portions of the first and second electrode patterns 123 and 124 so as to be exposed to the first and second main surfaces S1 and S2 of the ceramic body 110.

Board Having MLCC

Figure 12:
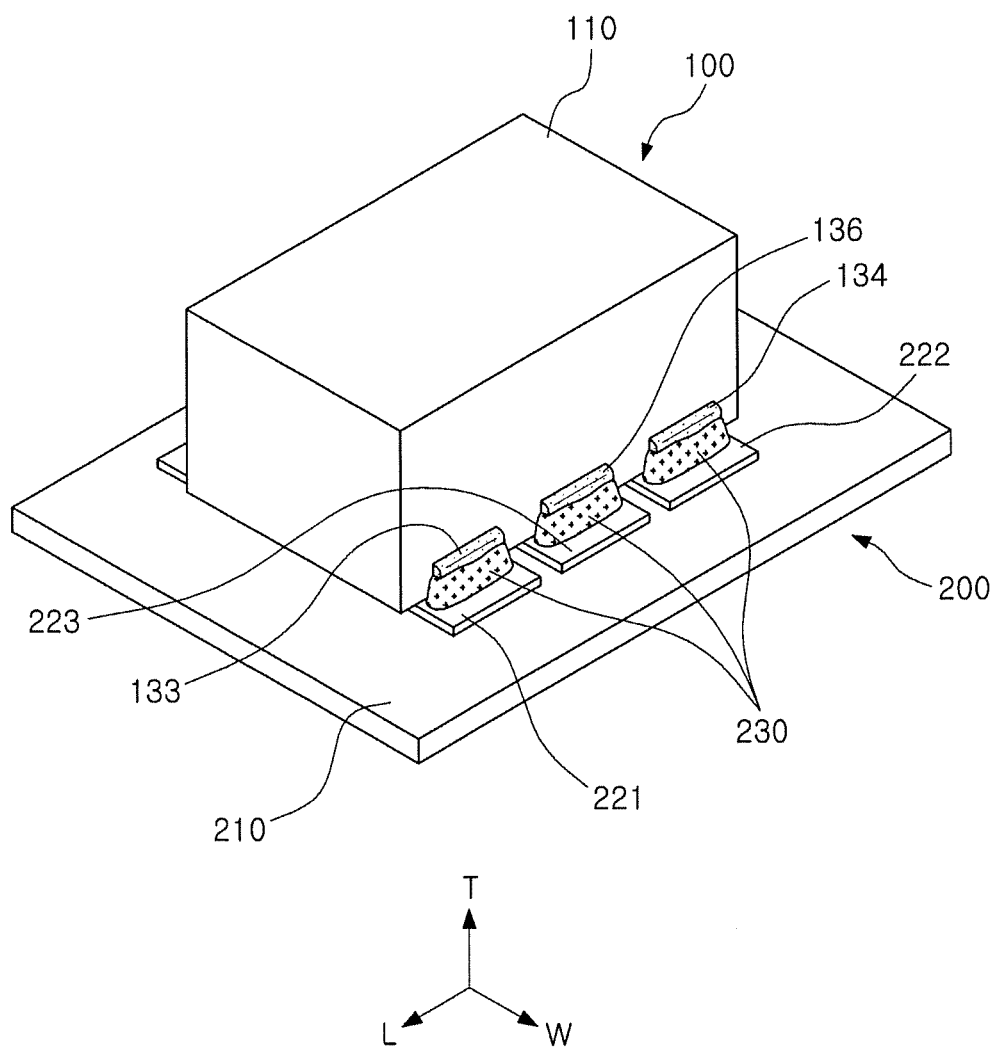
FIG. 12 is a perspective view illustrating a board in which the MLCC of FIG. 1 is mounted on a circuit board.
Figure 13:
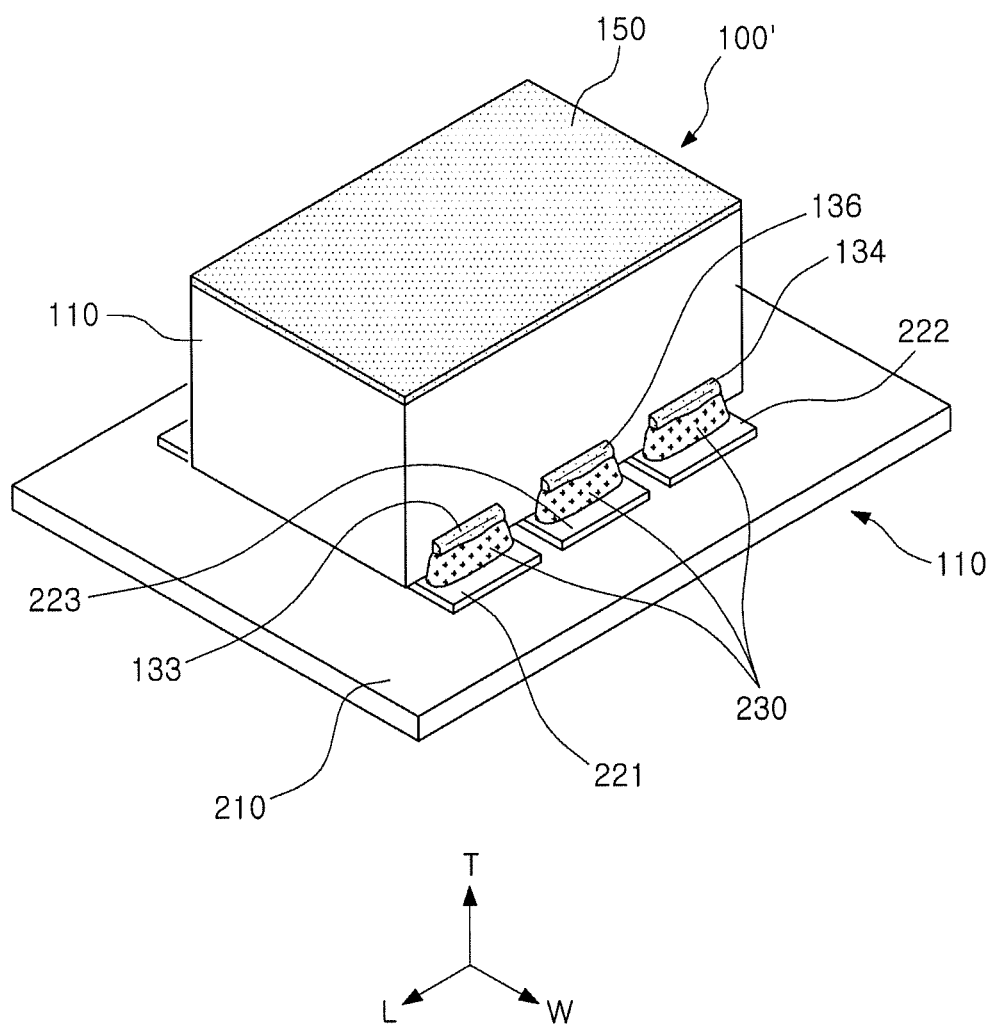
FIG. 13 is a perspective view illustrating a board in which the MLCC of FIG. 4 is mounted on a circuit board.
Figure 14:
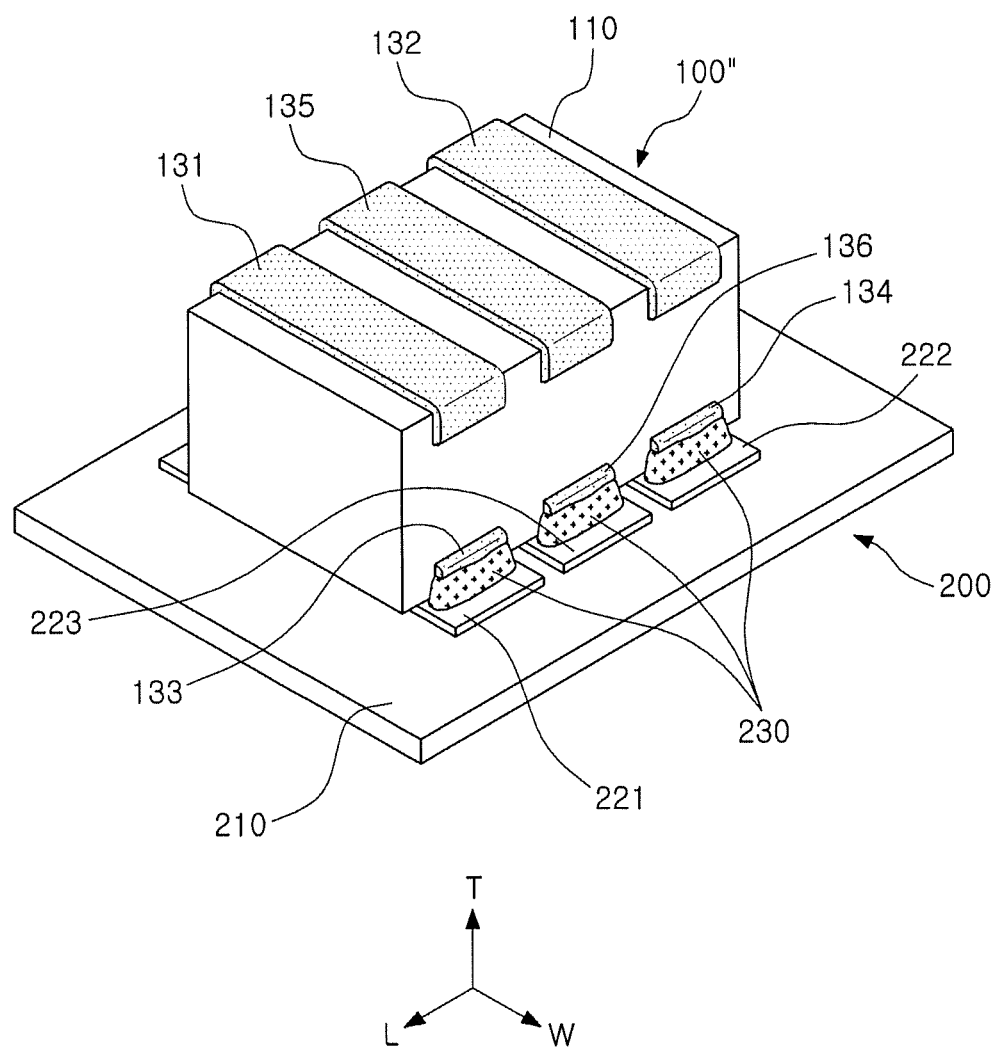
FIG. 14 is a perspective view illustrating a board in which the MLCC of FIG. 6 is mounted on a circuit board.
Figure 15:
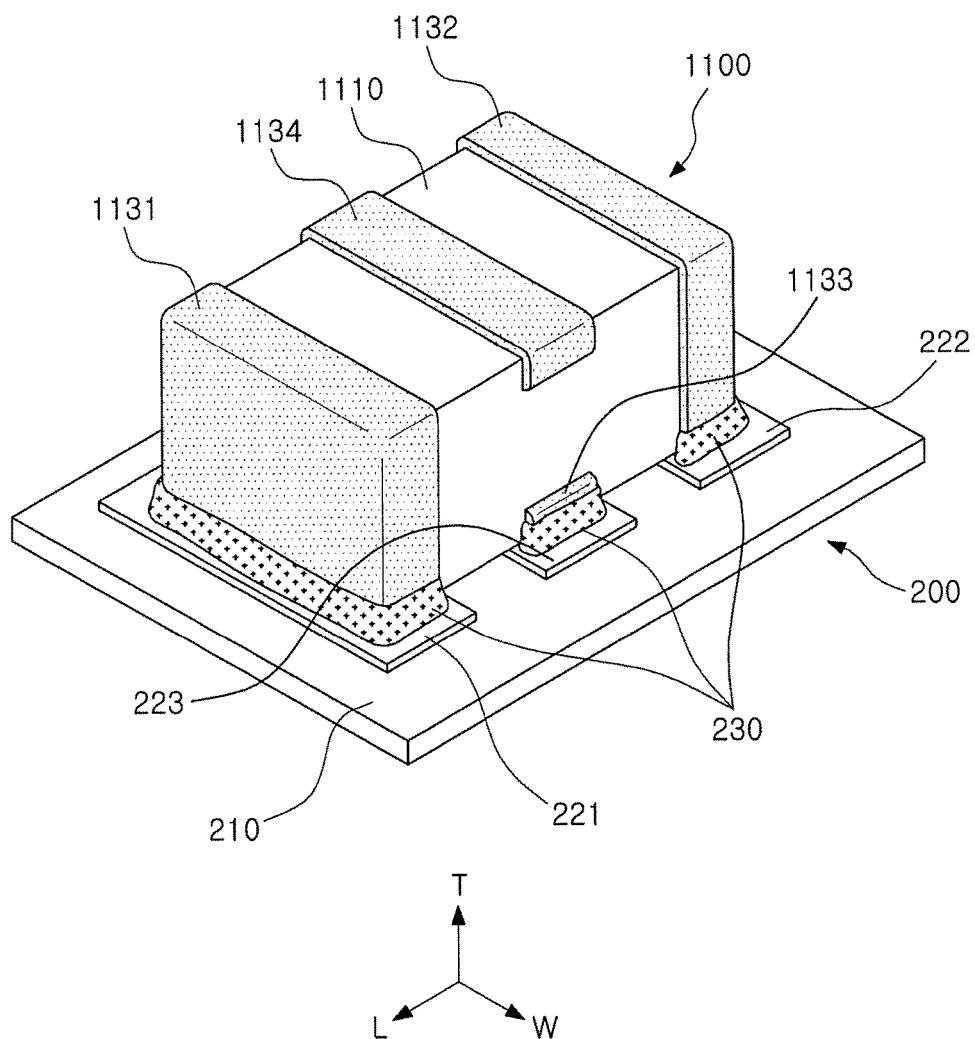
FIG. 15 is a perspective view illustrating a board in which the MLCC of FIG. 9 is mounted on a circuit board.

FIG. 12 is a perspective view illustrating a board in which the MLCC of FIG. 1 is mounted on a circuit board, FIG. 13 is a perspective view illustrating a board in which the MLCC of FIG. 4 is mounted on a circuit board, FIG. 14 is a perspective view illustrating a board in which the MLCC of FIG. 6 is mounted on a circuit board, and FIG. 15 is a perspective view illustrating a board in which the MLCC of FIG. 9 is mounted on a circuit board.

Referring to FIGS. 12 through 15, a board 200 having the MLCC 100, 100', 100", or 1100 according to an exemplary embodiment may include a circuit board 210 on which the MLCC 100, 100', 100", or 1100 is mounted, and first to third electrode pads 221, 222, and 223 which are formed to be spaced apart from one another on an upper surface of the circuit board 210.

Here, the MLCC 100, 100', 100", or 1100, with the first main surface S1 of the ceramic body 110 or 1110 being a mounting surface, is mounted on the circuit board 210, and the first to third external electrodes 133, 134, and 136 or the first to third terminal electrodes 1131, 1132, and 1133 may be connected to the circuit board 210 by solders 230, in a state in which the first to third external electrodes 133, 134, and 136 or the first to third terminal electrodes 1131, 1132, and 1133 are positioned to be in contact with the first to third electrode pads 221, 222, and 223, so as to be electrically connected thereto.

In the related art 3-terminal MLCC, since direct current (DC) flows concentratively through the lowermost inner electrode layer disposed to face the circuit board, heating is locally generated to lower insulation resistance, degrading reliability.

However, in the exemplary embodiment of the present inventive concept, since current evenly flows across the entire internal electrodes by the first and second regions A and B, the possibility of degrading reliability may be reduced.

In the MLCCs according to the exemplary embodiments, the internal electrodes may be disposed to be perpendicular with respect to the board and positive and negative polarity terminals may be disposed to be adjacent to one another, shortening a path of current flowing from the positive electrode terminal to the negative electrode terminal through the electrode pads of the board.

Thus, compared to the related art 3-terminal MLCC in which internal electrodes are horizontally disposed with respect to the board and positive and negative polarity terminals are disposed to be distant from one another, the MLCCs according to the exemplary embodiments may have reduced equivalent series inductance (ESL) and the improved high frequency noise removal effect.

For example, in a case in which the MLCC 100 of FIG. 12 is used as a 3-terminal EMI filter, the first and second external electrodes 133 and 134 may be connected to an input terminal and an output terminal of a signal line, respectively, and the third external electrode 136 may be connected to a ground terminal thereof, thus effectively removing high frequency noise of the signal line.

In this case, in the circuit board 210, the first and second electrode pads 221 and 222 having a positive (+) polarity correspond to the input terminal and the output terminal, respectively, and the third electrode pad 223 having a negative (−) polarity corresponds to the ground terminal.

In another example, in a case in which the MLCC 100 of FIG. 12 is used as a decoupling capacitor, the first and second external electrodes 133 and 134 may be connected to a power line and the third external electrode 136 may be connected to a ground line so as to effectively stabilize a power circuit.

In this case, the first and second electrode pads 221 and 222 correspond to a power line, and the third electrode pad 223 corresponds to a ground terminal.

As set forth above, according to exemplary embodiments of the present disclosure, DC resistance of the MLCC may be reduced, such that an allowable current value may be set to have a high level. In addition, internal power loss is reduced, and reliability and a degradation of lifespan due to heating may be prevented. Thus, when the MLCC is used as a decoupling capacitor, an EMI filter, and the like, fluctuations in voltage of a power circuit may be effectively suppressed, and high frequency attenuation characteristics and high frequency noise removal effect may be enhanced.

While exemplary embodiments have been shown and described above, it will be apparent to those skilled in the art that modifications and variations could be made without departing from the spirit and scope of the invention as defined by the appended claims.

What is claimed is:

1. A multilayer ceramic capacitor comprising:
   a ceramic body including a plurality of dielectric layers laminated in a width direction thereof;
   first internal electrodes each including a first lead portion which extends to be exposed to a mounting surface of the ceramic body;
   second internal electrodes each including a third lead portion which extends to be exposed to the mounting surface of the ceramic body and is disposed to be spaced apart from the first lead portion;
   a first external electrode disposed on the mounting surface of the ceramic body and connected to the first lead portion; and
   a third external electrode disposed to be spaced apart from the first external electrode on the mounting surface of the ceramic body and connected to the third lead portion,
   wherein the ceramic body includes a first region positioned in a central portion of the ceramic body in a stacking direction of the dielectric layers and including the first internal electrodes with the dielectric layers interposed therebetween, and second regions positioned on both sides of the intervening first region in the stacking direction of the dielectric layers and including the first and second internal electrodes alternately disposed with the dielectric layers interposed therebetween, wherein the first region does not include the second internal electrodes, and
   wherein a thickness of a dielectric layer in the first region is different than a thickness of a dielectric layer in the second regions.

2. The multilayer ceramic capacitor of claim 1, wherein the first and second internal electrodes are disposed to be spaced apart from both side surfaces of the ceramic body in the length direction.

3. The multilayer ceramic capacitor of claim 1, wherein the first to third external electrodes extend from the mounting surface of the ceramic body to portions of both side surfaces of the ceramic body in the width direction.

4. The multilayer ceramic capacitor of claim 1, further comprising:
   a fourth lead portion extending from each of the first internal electrodes to be exposed to a surface of the ceramic body opposing the mounting surface of the ceramic body;
   a sixth lead portion extending from each of the second internal electrodes to be exposed to the surface of the ceramic body opposing the mounting surface of the ceramic body and disposed to be spaced apart from the fourth lead portion; and
   an insulating layer disposed on the surface of the ceramic body opposing the mounting surface of the ceramic body.

5. The multilayer ceramic capacitor of claim 1, further comprising:
   a fourth lead portion extending from each of the first internal electrodes to be exposed to the surface of the ceramic body opposing the mounting surface of the ceramic body;
   a sixth lead portion extending from each of the second internal electrodes to be exposed to the surface of the ceramic body opposing the mounting surface of the ceramic body and disposed to be spaced apart from the fourth lead portion;
   a fourth external electrode disposed on the surface of the ceramic body opposing the mounting surface of the ceramic body and connected to the fourth lead portion; and
   a sixth external electrode disposed to be spaced apart from the fourth external electrode on the surface of the ceramic body opposing the mounting surface of the ceramic body and connected to the sixth lead portion.

6. The multilayer ceramic capacitor of claim 5, wherein the fourth to sixth external electrodes extend from the surface of the ceramic body opposing the mounting surface of the ceramic body to portions of both side surfaces of the ceramic body in the width direction.

7. A board having a multilayer ceramic capacitor, the board comprising:
   a circuit board on which first to third electrode pads are provided; and
   the multilayer ceramic capacitor of claim 1,
   wherein the first to third external electrodes of the multilayer ceramic capacitor are disposed on the first to third electrode pads, respectively.

8. The multilayer ceramic capacitor of claim 1, wherein the thickness of the dielectric layer in the first region is smaller than the thickness of the dielectric layer in the second regions.

9. The multilayer ceramic capacitor of claim 1, wherein the first and second regions are arranged in a direction perpendicular to the mounting surface of the ceramic body.

* * * * *